(12) United States Patent
Meganathan et al.

(10) Patent No.: US 12,086,001 B2
(45) Date of Patent: Sep. 10, 2024

(54) SYSTEM AND METHOD FOR PROACTIVELY CONTROLLING AN ENVIRONMENTAL CONDITION IN A SERVER RACK OF A DATA CENTER BASED AT LEAST IN PART ON SERVER LOAD

(71) Applicant: Honeywell International Inc., Charlotte, NC (US)

(72) Inventors: Deepak Sundar Meganathan, Bangalore (IN); Jayaprakash Meruva, Bangalore (IN); Magesh Lingan, Bangalore (IN); Sangappa Paraddi, Bangalore (IN); Srikanth Nagaraj, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 92 days.

(21) Appl. No.: 17/749,047

(22) Filed: May 19, 2022

(65) Prior Publication Data
US 2023/0376093 A1  Nov. 23, 2023

(51) Int. Cl.
*G06F 1/20* (2006.01)
*G06F 11/30* (2006.01)

(52) U.S. Cl.
CPC .......... *G06F 1/206* (2013.01); *G06F 11/3058* (2013.01)

(58) Field of Classification Search
CPC ...................................................... G06F 1/206
See application file for complete search history.

(56) References Cited

U.S. PATENT DOCUMENTS 10,001,761 B2 * 6/2018 VanGilder ............. G06F 1/3203
10,254,720 B2   4/2019 Slessman et al.
(Continued)

FOREIGN PATENT DOCUMENTS

CN   111928429 A  * 11/2020
EP   3525563 A1    8/2019
(Continued)

OTHER PUBLICATIONS

"The Must-Have Cooling Solution That Pays for Itself", Data Center/Vigilent, pp. 1-4, Feb. 15, 2022.
(Continued)

*Primary Examiner* — Suresh Suryawanshi
(74) *Attorney, Agent, or Firm* — Seager, Tufte & Wickhem, LLP

(57) ABSTRACT

One or more environmental conditions within each of a plurality of server racks are received over time. One or more IT parameters representative of server load are received over time. A model is constructed that models how one or more of the environmental conditions within at least one of the server racks of the plurality of server racks responds to changes in one or more of the IT parameters. A future value of one or more environmental conditions within one or more of the plurality of server racks is predicted based at least in part on the model and the one or more subsequent received IT parameters. At least some of the environmental control equipment of the data center is proactively controlled based at least in part on the predicted future value of one or more of the environmental conditions within the one or more server racks.

18 Claims, 12 Drawing Sheets

(56) References Cited

U.S. PATENT DOCUMENTS

| | | | |
|---|---|---|---|
| 2010/0010678 A1* | 1/2010 | Dawson | H05K 7/20836 700/276 |
| 2010/0076607 A1* | 3/2010 | Ahmed | G06F 1/206 700/297 |
| 2015/0378404 A1 | 12/2015 | Ogawa et al. | |
| 2017/0219241 A1* | 8/2017 | Magcale | H05K 7/20836 |
| 2018/0089042 A1* | 3/2018 | Demetriou | G06Q 10/0631 |
| 2019/0145645 A1 | 5/2019 | Magcale | |
| 2020/0348993 A1* | 11/2020 | Ozonat | G06N 3/08 |
| 2020/0379529 A1* | 12/2020 | Le Goff | G01K 1/022 |
| 2022/0087075 A1 | 3/2022 | Heydari et al. | |
| 2023/0047829 A1* | 2/2023 | Meruva | G06F 11/3476 |

FOREIGN PATENT DOCUMENTS

| | | |
|---|---|---|
| GB | 2600245 A | 4/2022 |
| GB | 2604230 A | 8/2022 |
| JP | 06834773 B2 | 2/2021 |
| WO | 2015134655 A2 | 9/2015 |
| WO | 2019119142 A1 | 6/2019 |
| WO | 2020176080 A1 | 9/2020 |

OTHER PUBLICATIONS

"Server Power and Performance Evaluation in High-Temperature Environments", Intel, pp. 1-8, 2012.

"Dynamic Control, Optimized Cooling", Dynamic Control/Vigilent, pp. 1-5, Feb. 15, 2022.

"Dynamic Optimization, Matching Cooling Output to Current Load", Dynamic Optimization/Vigilent, pp. 1-2, Feb. 15, 2022.

"Energy Savings, Start on Day One and Continue Forever", Energy Savings/Vigilent, pp. 1-2, Feb. 15, 2022.

"Machine Learning, Analyze, Learn, and Adapt", Machine Learning/Vigilent, pp. 1-5, Feb. 15, 2022.

"See Your Data Center Differently, Powerful Tools Deliver Unprecedented Visibility Into Facility Operations", Monitoring/Vigilent, pp. 1-5, Feb. 15, 2022.

"Reclaim Cooling Capacity, Free Up Cooling Capacity to Add Additional It Load", Reclaim Cooling Capacity/Vigilent, pp. 1-2, Feb. 15, 2022.

"System Architecture, Closed-Loop Control Manages Your Cooling Infrastructure", System Architecture/Vigilent, pp. 1-3, Feb. 15, 2022.

"Uptime Protection for Mission Critical Sites, Measure Where It Matters", Uptime Protection/Vigilent, pp. 1-4, Feb. 15, 2022.

Extended European Search Report, EP Application No. 23172415.4, European Patent Office, Oct. 18, 2023 (14 pgs).

Combined Search and Examination Report under Sections 17 and 18(3), GB Application No. GB2306924.8, GB Intellectual Property Office, Nov. 15, 2023 (5 pages).

* cited by examiner

SYSTEM AND METHOD FOR PROACTIVELY CONTROLLING AN ENVIRONMENTAL CONDITION IN A SERVER RACK OF A DATA CENTER BASED AT LEAST IN PART ON SERVER LOAD

TECHNICAL FIELD

The present disclosure pertains generally to monitoring data centers and more particularly to monitoring environmental conditions within data centers.

BACKGROUND

A data center typically includes a number of computer servers in close proximity to each other arranged in server racks. Because of the heat generated by having a number of computer servers in close proximity to each other, a data center includes cooling equipment such as CRAC (computer room air conditioners) units and/or CRAH (computer room air handlers) units in order to control environmental conditions such as temperature within and around each of the server racks. When sensed temperatures in or near one or more of the server racks increases, operation of the cooling equipment is typically adjusted to try to maintain temperatures within an acceptable range. It will be appreciated that such a system is reactive, as operation of the cooling equipment is adjusted in response to a sensed change in temperature. A need remains for improved systems and methods for anticipating and predicting changes in environmental conditions such as temperature and/or humidity such that the CRAC and/or CRAH units may be better able to control the environmental conditions within the data center, particularly when the computer servers in the data center are subject to dynamic IT load conditions.

SUMMARY

This disclosure relates generally to improved systems and methods for anticipating and predicting changes in environmental conditions such as temperature and/or humidity such that the cooling equipment may be better able to control the environmental conditions within the data center, particularly when the computer servers in the data center are subject to dynamic IT load conditions. In some instances, IT data may be used to predict power consumption.

An example may be found in a method for controlling one or more environmental conditions within one or more server racks of a data center, wherein the data center includes a plurality of server racks with each server rack hosting one or more servers. The data center includes environment control equipment for controlling the one or more environmental conditions within one or more of the plurality of server racks of the data center. The method includes receiving one or more environmental conditions within each of the plurality of server racks over time. One or more IT (Information Technology) parameters representative of a server load on one or more servers within each of the plurality of server racks are received over time. In some cases, the one or more IT parameters may include, for example, one or more of a CPU utilization parameter of a corresponding server, a CPU fan speed parameter of a corresponding server, an I/O throughput of a corresponding server, a memory access rate of a corresponding server, and a disk access rate of a corresponding server. In some cases, the one or more IT parameters may include one or more of a server temperature and a server power draw provided by a corresponding server. A model that models how one or more of the environmental conditions within at least one of the server racks of the plurality of server racks responds to changes in one or more of the IT parameters representative of the server load on one or more servers within the corresponding server rack is built over time. With the model built, one or more subsequent IT parameters representative of the server load on one or more servers within at least one of the plurality of server racks are received. A future value of one or more environmental conditions within one or more of the plurality of server racks is predicted based at least in part on the model and the one or more subsequent IT parameters and future power consumption may optionally be predicted based upon the one or more IT parameters. At least some of the environmental control equipment of the data center is proactively controlled based at least in part on the predicted future value of one or more of the environmental conditions within the one or more server racks.

Another example may be found in a method for controlling temperatures within a data center including a plurality of server racks, with a plurality of servers within each of the plurality of server racks. The data center includes a cooling capacity directable to each of the plurality of server racks. The illustrative method includes receiving an indication of one or more thermal properties within each of the plurality of server racks and receiving an indication of power consumption by one or more server racks of the plurality of server racks within the data center. Machine learning is used to predict future values of one or more of the thermal properties within the one or more server racks based at least in part upon the received indication of power consumption and the received one or more environmental conditions within each of the plurality of server racks. The cooling capacity directed to the one or more server racks is proactively controlled based at least in part on the predicted future values of one or more thermal properties within the one or more server racks.

Another example may be found in a system for controlling a temperature within one or more server racks of a data center, wherein the data center includes a plurality of server racks with each server rack hosting one or more servers. The data center includes environment control equipment for controlling the temperature within one or more of the plurality of server racks of the data center. The system includes a memory for storing a model that models how one or more of environmental conditions within at least one of the plurality of server racks responds to changes in one or more IT parameters representative of a server load on one or more servers within the corresponding server rack. The system further includes a controller that is operatively coupled to the memory. The controller is configured to receive one or more IT parameters representative of the server load on one or more servers within at least one of the plurality of server racks, predict a future value of one or more environmental conditions within one or more of the plurality of server racks based at least in part on the model and the one or more IT parameters, and proactively control at least some of the environment control equipment of the data center based at least in part on the predicted future value of one or more of the environmental conditions within the one or more server racks.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
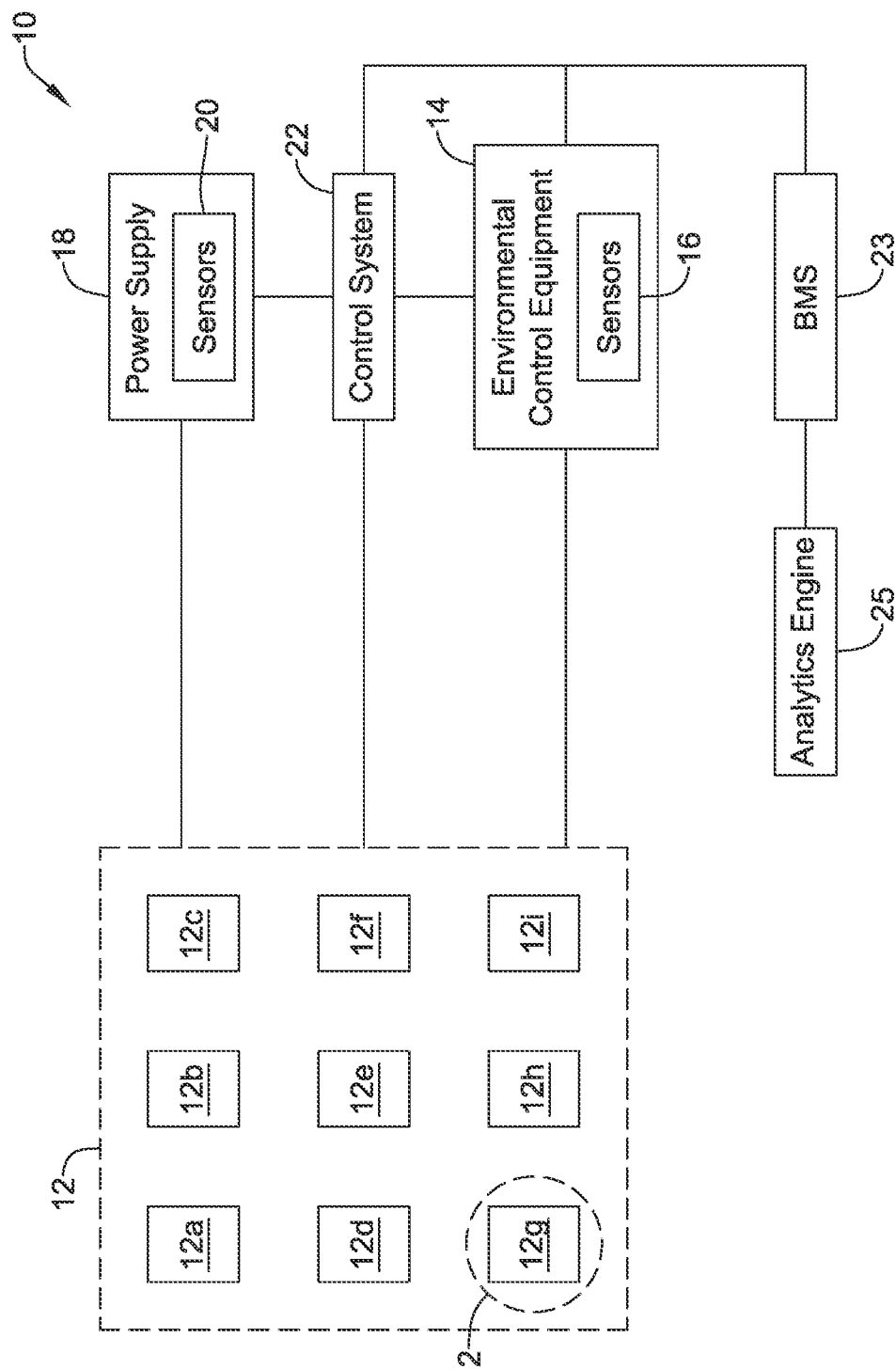
FIG. 1 is a schematic block diagram of an illustrative data center.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative data center 10. The illustrative data center 10 includes a number of server racks 12, individually labeled as 12a, 12b, 12c, 12d, 12e, 12f, 12g, 12h and 12i. This is merely illustrative, as the data center 10 may include a greater number of server racks 12, or even a substantially greater number of server racks 12. As will be shown with respect to FIG. 2, each of the server racks 12 include a number of computer servers.

The illustrative data center 10 includes environmental control equipment 14. The environmental control equipment 14 may be configured to control one or more environmental control parameters within the data center 10. In some cases, for example, the environmental control equipment 14 may include one or more CRAC (computer room air conditioning) units and/or one or more CRAH (computer room air handler) units. The environmental control equipment 14 may include one or more sensors 16 that monitor a variety of different performance parameters within the environmental control equipment 14. The one or more sensors 16 may be configured to communicate wirelessly. In some instances, the one or more sensors 16 may communicate over a wired and/or wireless network.

The illustrative data center 10 includes a power supply 18. The power supply 18 provides and monitors the electrical power that powers the server racks 12 and in some cases the environmental control equipment 14. While schematically shown as a single unit, it will be appreciated that the power supply 18 may actually include a large number of power supplies 18. For example, each server rack 12 or a group of server racks 12 may have its own power supply 18. In some instances, at least some of the environmental control equipment 14 may have its own power supply 18. The power supply 18 may include one or more sensors 20 that monitor a variety of different performance parameters within the power supply 18, such as various power-related performance parameters. The power-related performance parameters may include, but are not limited to, current, voltage, frequency, amplitude, noise and/or any other power-related performance parameter. In some cases, the power-related performance parameters may be tracked or logged over time. It is contemplated that the one or more sensors 20 may be configured to communicate wirelessly. In some instances, the one or more sensors 20 may communicate over a wired and/or wireless network.

The illustrative data center 10 includes a control system 22 that is operably coupled with the environmental control equipment 14 and its sensors 16, the power supply 18 and its sensors 20, and the server racks 12. The control system 22 is configured to receive signals from the sensors 16 and the sensors 20 and to use those signals to control operation of the environmental control equipment 14 and in some cases the power supply 18. In some instances, the control system 22 may also be configured to receive signals from sensors within the server racks 12 and/or computer servers within the server racks 12. The control system 22 may be configured to control at least some functionality within the server racks 12. Further details regarding the control system 22 will be discussed with respect to FIG. 3. In some cases, the data center 10 may include a BMS (Building Management System) 23 that may be operably coupled with the control system 22 and/or the environmental control equipment 14. An analytics engine 25, which may be remote from the data center 10, may be operably coupled with the BMS 23.

Figure 2:
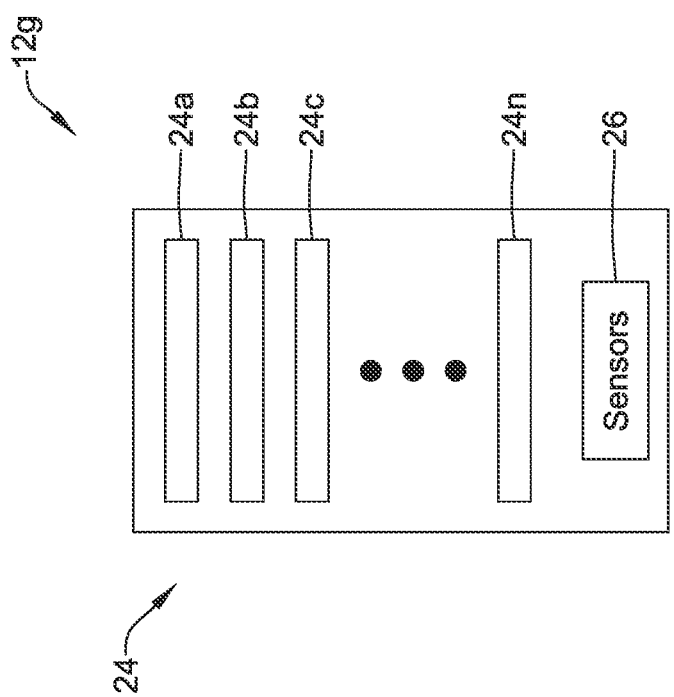
FIG. 2 is a schematic block diagram of an illustrative server rack of the illustrative data center of FIG. 1.

FIG. 2 provides an enlarged view of one of the server racks 12g of FIG. 1. It will be appreciated that the server rack 12g may be considered as being an example of any of the server racks 12, including the server racks 12a, 12b, 12c, 12d, 12e, 12f, 12h and 12i. The server rack 12g includes a number of individual computer servers 24, individually labeled as 24a, 24b, 24c and through 24n. The computer servers 24 may be known as server blades, for example. Each of the computer servers 24 are assigned to particular tenants of the data center 10. In some cases, one or more of the server racks 12, such as the server rack 12g, may be assigned to a single tenant. In some cases, a server rack 12, such as the server rack 12g, may be divided between two or more tenants. For example, several tenants having modest computing needs may share a server rack 12, such as the server rack 12g.

The server rack 12g, and indeed each of the server racks 12, have one or more sensors 26 disposed within or proximate to the server rack 12g. The one or more sensors 26 may include environmental parameter sensors such as but not limited to temperature sensors and humidity sensors. The one or more sensors 26 may include power-related sensors that provide signals indicative of power consumption by the individual computer servers 24 and/or for the server rack 12g. The one or more sensors 26 are configured to communicate with the control system 22 (FIG. 1). In some cases, the one or more sensors 26 may communicate wirelessly with the control system 22. In some instances, the one or more sensors 26 may communicate over a wired and/or wireless network that the control system 22 is also operably connected with.

Figure 3:
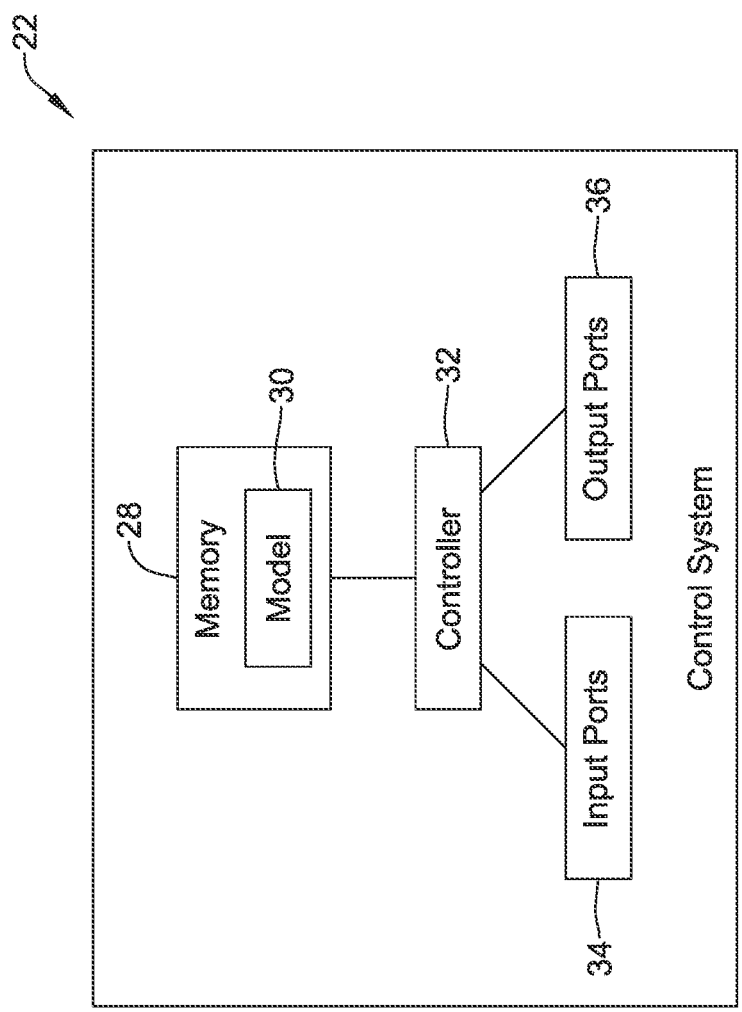
FIG. 3 is a schematic block diagram of an illustrative control system of the illustrative data center of FIG. 1.

FIG. 3 is a schematic block diagram of the illustrative control system 22 of FIG. 1. As noted, the illustrative control system 22 is configured to control operation of the environmental control equipment 14 (FIG. 1) in order to control environmental conditions within the data center 10 in general, and within and near the server racks 12 in particular. Environmental conditions within the data center 10 may include temperature and humidity, for example. Environmental conditions within the data center 10 may include indoor air quality parameters, such as particulate matter (PM). In some cases, the indoor air quality parameters may include but are not limited to concentrations of pollutants such as carbon monoxide, carbon dioxide, volatile organic compounds (VOCs) and particulate matter (PM). Environmental conditions controllable within the data center 10 may include a fresh air exchange rate.

The illustrative control system 22 of FIG. 3 includes a memory 28. The memory 28 is configured to store a model 30. In some cases, the model is configured to model how one or more of environmental conditions within at least one of the plurality of server racks 12 responds to changes in one or more IT parameters representative of a server load on one or more servers 24 within the corresponding server rack 12. In some cases, the one or more IT parameters may include, for example, one or more of a CPU utilization parameter of a corresponding server, a CPU fan speed parameter of a corresponding server, an I/O throughput of a corresponding server, a memory access rate of a corresponding server, and a disk access rate of a corresponding server. In some cases, the one or more IT parameters may include one or more of a server temperature and a server power draw provided by a corresponding server.

The illustrative control system 22 includes a controller 32 that is operably coupled to the memory 28. The controller 32 is operably coupled with one or more input ports 34 and one or more output ports 36 that allow the controller 32, and hence the control system 22, to communicate with other devices, including the sensors 16, 20 and 26, for example.

The controller 32 is configured to receive one or more IT parameters representative of the server load on one or more servers 24 within at least one of the plurality of server racks 12. The controller 32 is configured to predict a future value of one or more environmental conditions within one or more of the plurality of server racks 12 based at least in part on the model and the one or more IT parameters. In some instances, the controller 32 may also be configured to predict future power consumption for one or more of the servers 24 within at least one of the plurality of server racks 12, for example.

In some cases, the controller 32 may be configured to build the model 30 by receiving one or more environmental conditions within each of the plurality of server racks 12 over time, receiving one or more IT parameters representative of a server load on one or more servers 24 within each of the plurality of server racks 12 over time, and building the model 30 that models how one or more of the environmental conditions within at least one of the server racks 12 of the plurality of server racks 12 responds to changes in one or more of the IT parameters representative of the server load on one or more servers 24 within the corresponding server rack 12. It is contemplated that building the model may including starting with a model template and then configuring the model template for the particular application at hand. In some cases, the controller 32 uses machine learning to build the model 30 for the particular application at hand.

The controller 32 is configured to proactively control at least some of the environmental control equipment 14 of the data center 10 based at least in part on the predicted future value of one or more of the environmental conditions within the one or more server racks 12. In some instances, the controller 32 may be configured to proactively control at least some of the environmental control equipment 14 of the data center 10 such that the predicted future value of one or more of the environmental conditions within the one or more server racks 12 remain below a corresponding threshold value or otherwise remains within an acceptable range. Proactively controlling at least some of the environmental control equipment 14 of the data center 10 may include proactively controlling at least some of the environmental control equipment 14 of the data center 10 such that the actual future value of one or more of the environmental conditions within the one or more server racks 12 remain below a corresponding threshold value or otherwise remains within an acceptable range.

In some instances, one or more of the environmental conditions within one or more of the plurality of server racks may include temperature. In some instances, the environmental control equipment 14 of the data center 10 may include cooling equipment, and proactively controlling at least some of the environmental control equipment 14 of the data center 10 may include proactively controller the cooling equipment based at least in part on the predicted future value of the temperature within the one or more server racks 12.

Figure 4:
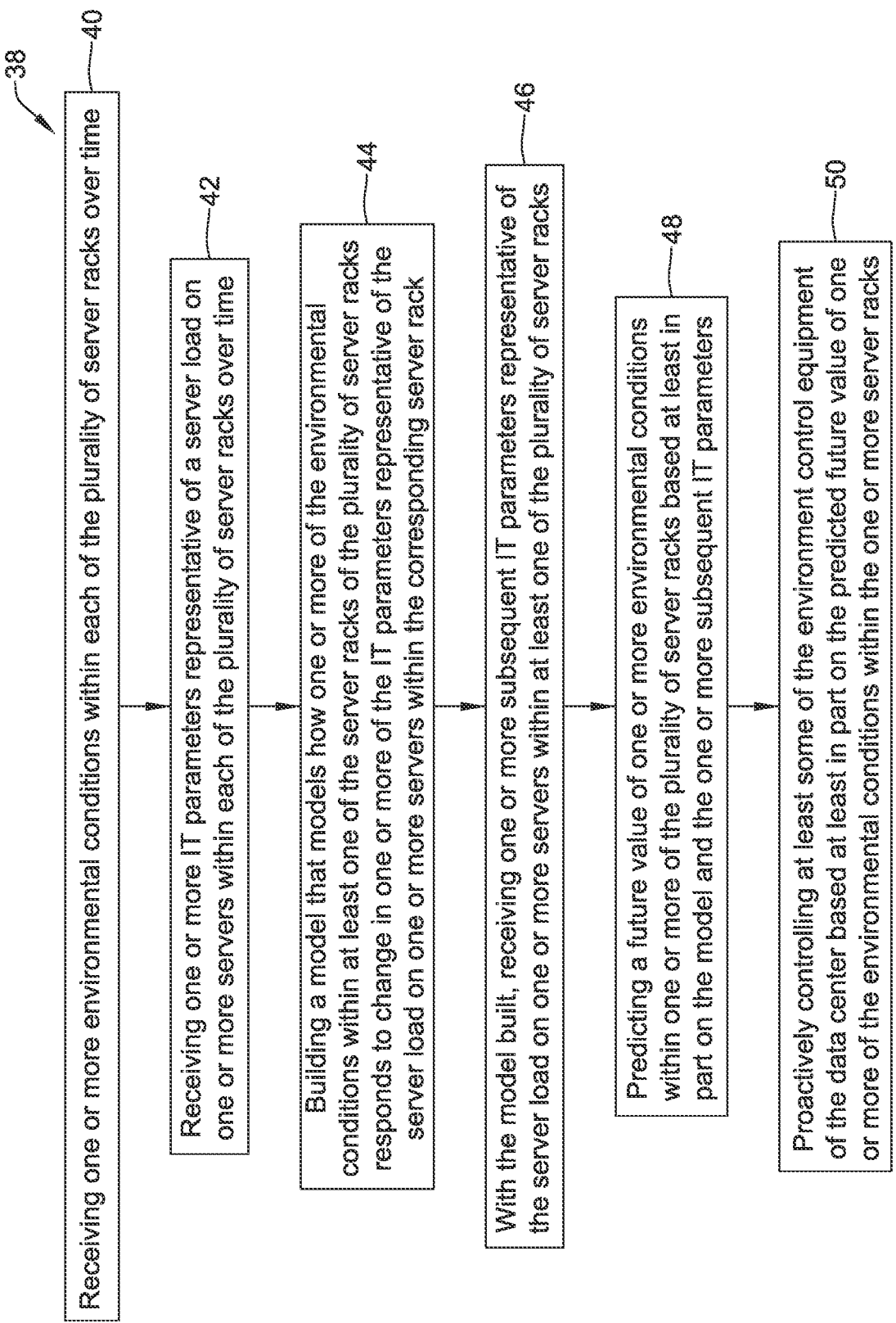
FIG. 4 is a flow diagram showing an illustrative method.

FIG. 4 is a flow diagram showing an illustrative method 38 for controlling one or more environmental conditions within one or more server racks (such as the server racks 12) of a data center (such as the data center 10). The illustrative method 38 includes receiving one or more environmental conditions within each of the plurality of server racks over time, as indicated at block 40. One or more IT parameters representative of a server load on one or more servers within each of the plurality of server racks are received over time, as indicated at block 42. The one or more IT parameters may include one or more of a CPU utilization parameter of a corresponding server, a CPU fan speed parameter of a corresponding server, an I/O throughput of a corresponding server, a memory access rate of a corresponding server, and a disk access rate of a corresponding server. In some cases, the one or more IT parameters may include one or more of a server temperature and a server power draw provided by a corresponding server.

The illustrative method 38 includes building a model that models how one or more of the environmental conditions within at least one of the server racks of the plurality of server racks responds to changes in one or more of the IT parameters representative of the server load on one or more servers within the corresponding server rack, as indicated at block 44. With the model built, one or more subsequent IT parameters representative of the server load on one or more servers within at least one of the plurality of server racks are received, as indicated at block 46. A future value of one or more environmental conditions within one or more of the plurality of server racks is predicted based at least in part on the model and the one or more subsequent IT parameters, as indicated at block 48. In some cases, building the model includes machine learning. The future value of one or more of the environmental conditions may be predicted to occur at a future time, and the future value of the one or more of the environmental conditions may be compared to a corresponding measured value of the one or more of the environmental conditions measured at the future time in order to provide feedback for machine learning.

At least some of the environmental control equipment of the data center is proactively controlled based at least in part on the predicted future value of one or more of the environmental conditions within the one or more server racks, as indicated at block 50. In some cases, proactively controlling at least some of the environmental control equipment of the data center may include proactively controlling at least some of the environmental control equipment of the data center such that the predicted future value of one or more of the environmental conditions, such as but not limited to temperature, within the one or more server racks remain below a corresponding threshold value or otherwise remains within an acceptable range. When the environment control equipment of the data center includes cooling equipment, proactively controlling at least some of the environmental control equipment of the data center may include proactively controller the cooling equipment based at least in part on the predicted future value of the temperature within the one or more server racks. Humidity may be similarly proactively controlled.

Figure 5:
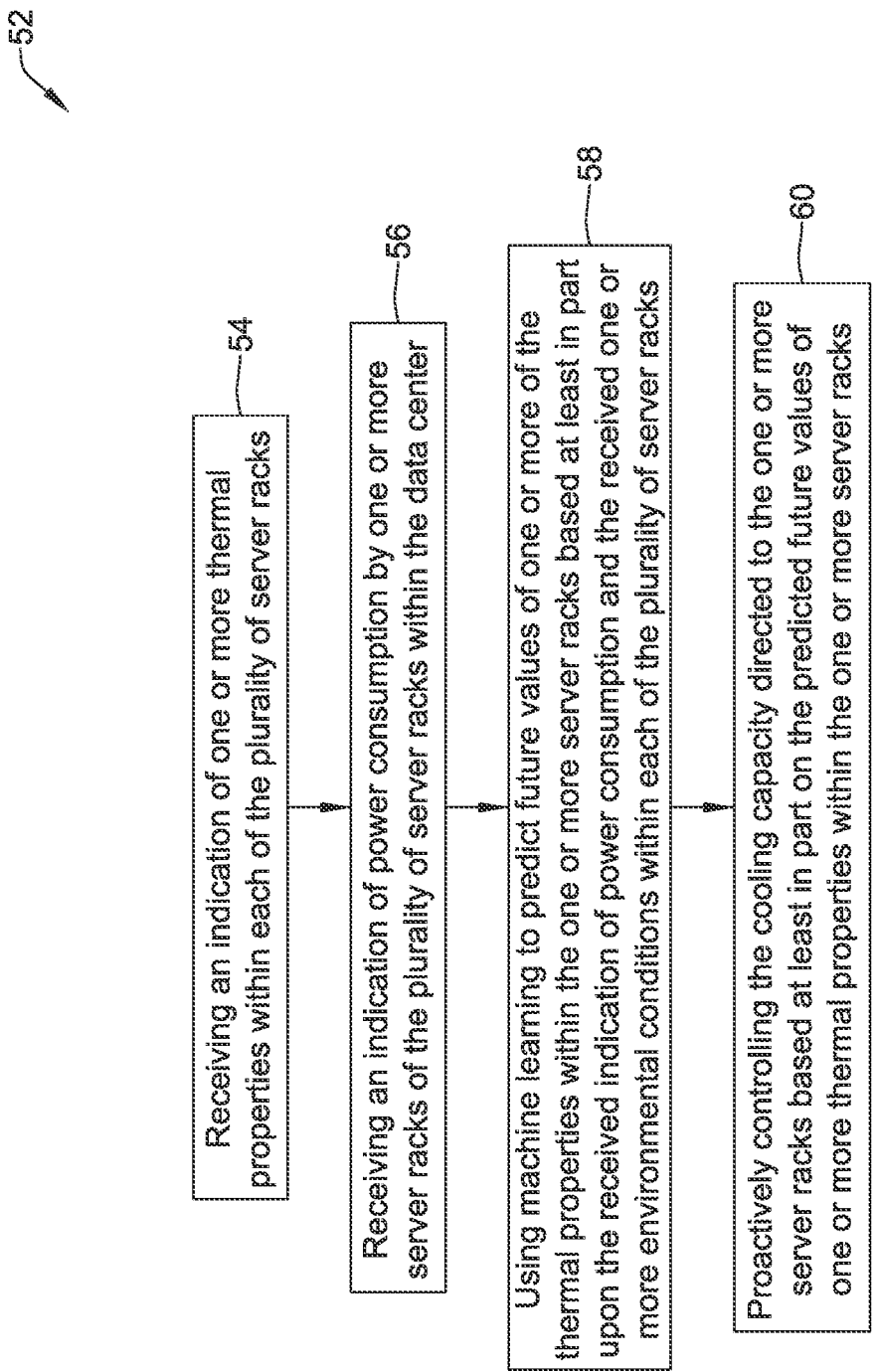
FIG. 5 is a flow diagram showing an illustrative method.

FIG. 5 is a flow diagram showing an illustrative method 52 for controlling temperatures within a data center (such as the data center 10) that includes a plurality of server racks (such as the server racks 12), with a plurality of computer servers (such as the computer servers 24) within each of the plurality of server racks. The data center includes a cooling capacity directable to each of the plurality of server racks. In some cases, the cooling capacity is individually directable at each of the server racks, or at predefined groups of server racks. The illustrative method 52 includes receiving an indication of one or more thermal properties within each of the plurality of server racks, as indicated at block 54. An indication of power consumption by one or more server racks of the plurality of server racks within the data center is received, as indicated at block 56. Machine learning is used to predict future values of one or more of the thermal properties within the one or more server racks based at least in part upon the received one or more environmental conditions and/or the received indication of power consumption within each of the plurality of server racks, as indicated at block 58.

The cooling capacity directed to the one or more server racks is proactively controlled based at least in part on the predicted future values of one or more thermal properties within the one or more server racks, as indicated at block 60. One or more of the thermal properties within the one or more server racks may include temperature and/or humidity, for example. In some cases, the cooling capacity directed to the one or more server racks may be increased when the predicted future value of one or more thermal properties is predicted to exceed a corresponding threshold. In some cases, the cooling capacity directed to the one or more server racks is decreased when the predicted future value of one or more thermal properties is predicted to drop below a corresponding threshold.

In some cases, the data center 10 includes a BMS (such as the BMS 23) that is in communication with an analytics engine (such as the analytics engine 25) that is remote from the data center 10. The illustrative method 52 may include using machine learning on the remote analytics engine to predict the future values of one or more thermal properties within the one or more server racks based at least in part upon the received indication of power consumption and/or the received one or more environmental conditions within each of the plurality of server racks. The method 52 may include the BMS controlling the cooling capacity directed to the one or more server racks based at least in part on the predicted future values of one or more thermal properties within the one or more server racks.

Figure 6:
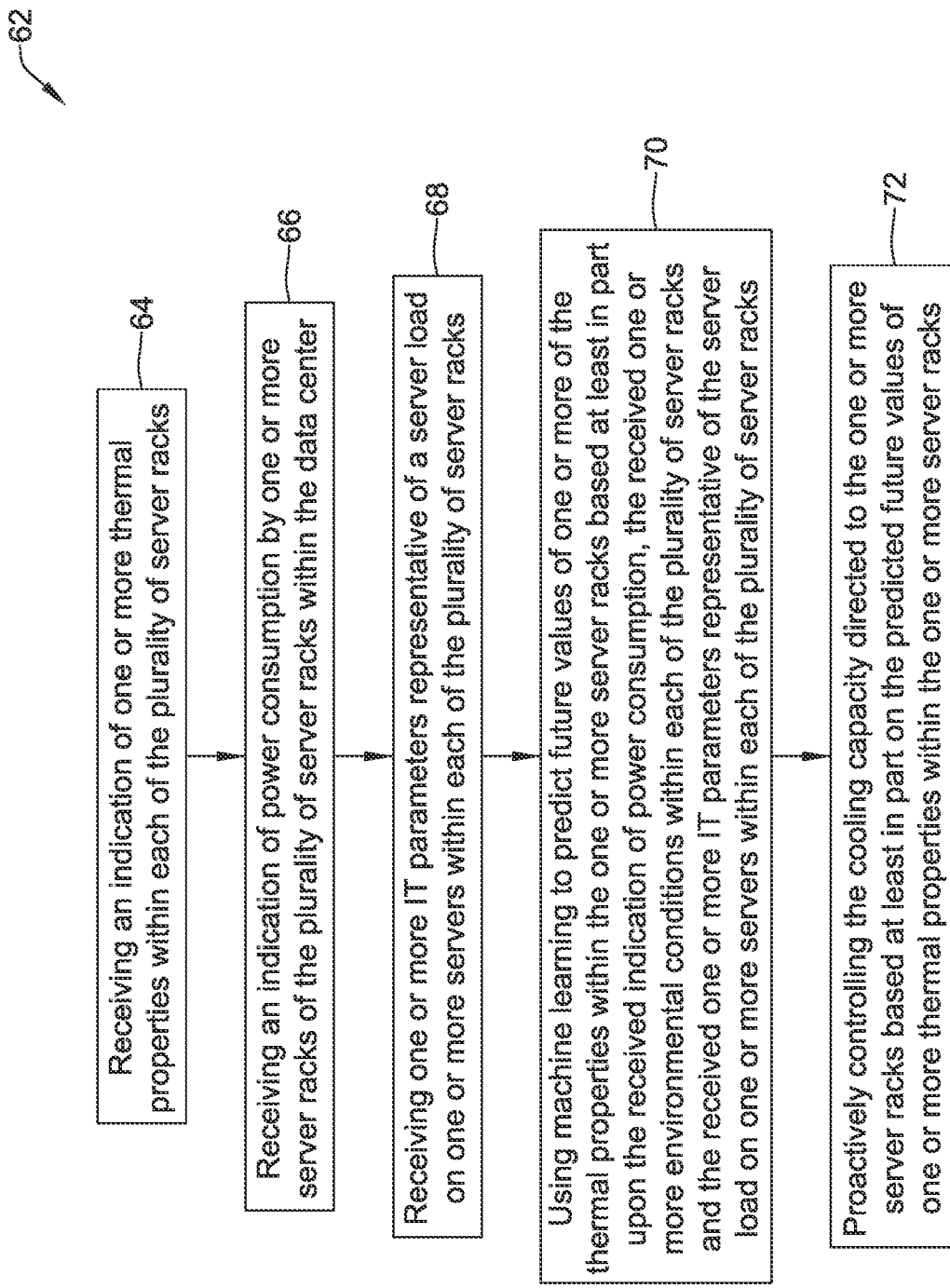
FIG. 6 is a flow diagram showing an illustrative method.

FIG. 6 is a flow diagram showing an illustrative method 62 for controlling temperatures within a data center (such as the data center 10) including a plurality of server racks (such as the server racks 12), with a plurality of computer servers (such as the computer servers 24) within each of the plurality of server racks. The data center includes a cooling capacity directable to each of the plurality of server racks. In some cases, the cooling capacity is individually directable at each of the server racks, or at predefined groups of server racks. The illustrative method 62 includes receiving an indication of one or more thermal properties within each of the plurality of server racks, as indicated at block 64. An indication of power consumption by one or more server racks of the plurality of server racks within the data center is received, as indicated at block 66.

One or more IT parameters representative of a server load on one or more servers within each of the plurality of server rack are received, as indicated at block 68. The one or more IT parameters may include one or more of a CPU utilization parameter of a corresponding server, a CPU fan speed parameter of a corresponding server, an I/O throughput of a corresponding server, a memory access rate of a corresponding server, and a disk access rate of a corresponding server. In some cases, the one or more IT parameters may include one or more of a server temperature and a server power draw provided by a corresponding server.

Machine learning may be used to predict future values of one or more of the thermal properties within the one or more server racks based at least in part upon the received one or more environmental conditions within each of the plurality of server racks and the received one or more IT parameters representative of the server load on one or more servers within each of the plurality of server racks, as indicated at block 70. In some cases, the received indication of power consumption may also be used. One or more of the environmental conditions within each of the plurality of server racks may include one or more of a server rack temperature sensed by the corresponding server rack, a server rack power draw sensed by the corresponding server rack, a server rack humidity data sensed by the corresponding server rack and/or a server rack pressure data sensed by the corresponding server rack. The cooling capacity directed to the one or more server racks is proactively controlled based at least in part on the predicted future values of one or more thermal properties within the one or more server racks, as indicated at block 72.

Figure 7:
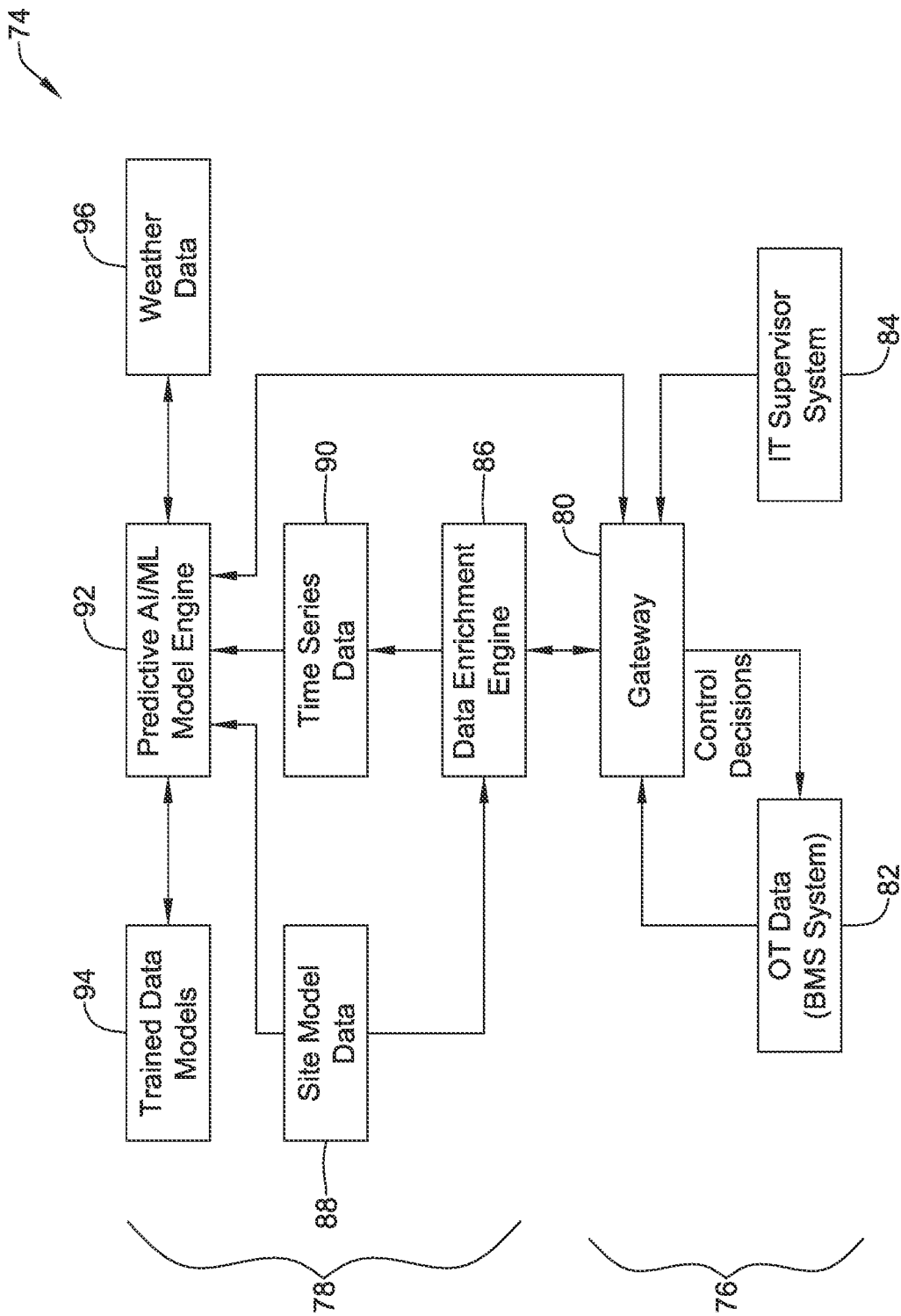
FIG. 7 is a schematic block diagram showing an illustrative method.

FIG. 7 is a schematic block diagram showing an illustrative system 74 that may be considered as being divided into an edge, or local, component 76 and a cloud, or remote, component 78. Within the local component 76, an edge gateway 80 collects data such as OT (operational technology) data from an OT Data (BMS) system 82 and collects data such as IT data from an IT Supervisor System 84. Examples of OT data include but are not limited to server rack temperature, server rack power, cooling unit data, humidity and pressure. Examples of IT data include but are not limited to server computation utilization, CPU fan speed, server temperature and server power. Control decisions are provided to the BMS system 82 from the edge gateway 80. In some cases, those control decisions may be computed or otherwise derived at least partially within the cloud component 78, for example. In some cases, the control decisions are computed or otherwise derived entirely within the cloud component 78. In some cases, the control decisions are computed or otherwise derived by the edge gateway 80.

In the example shown, the cloud component 78 includes a data enrichment engine 86 that communicates with the edge gateway 80. The data enrichment engine 86 also provides data to a Site Model Data block 88 and a Time Series Data block 90. The Site Model Data block 88 and the Time Series Data block 90 both provide information to a Predictive AI (artificial intelligence)/ML (machine learning) Model Engine 92. The Predictive AI/ML Model Engine 92 communicates bidirectionally with a Trained Data Models block 94, and in some cases also receives weather information from a Weather Data block 96. In some cases, the Predictive AI/ML Model Engine 92 also communicates with the edge gateway 80.

Figure 8:
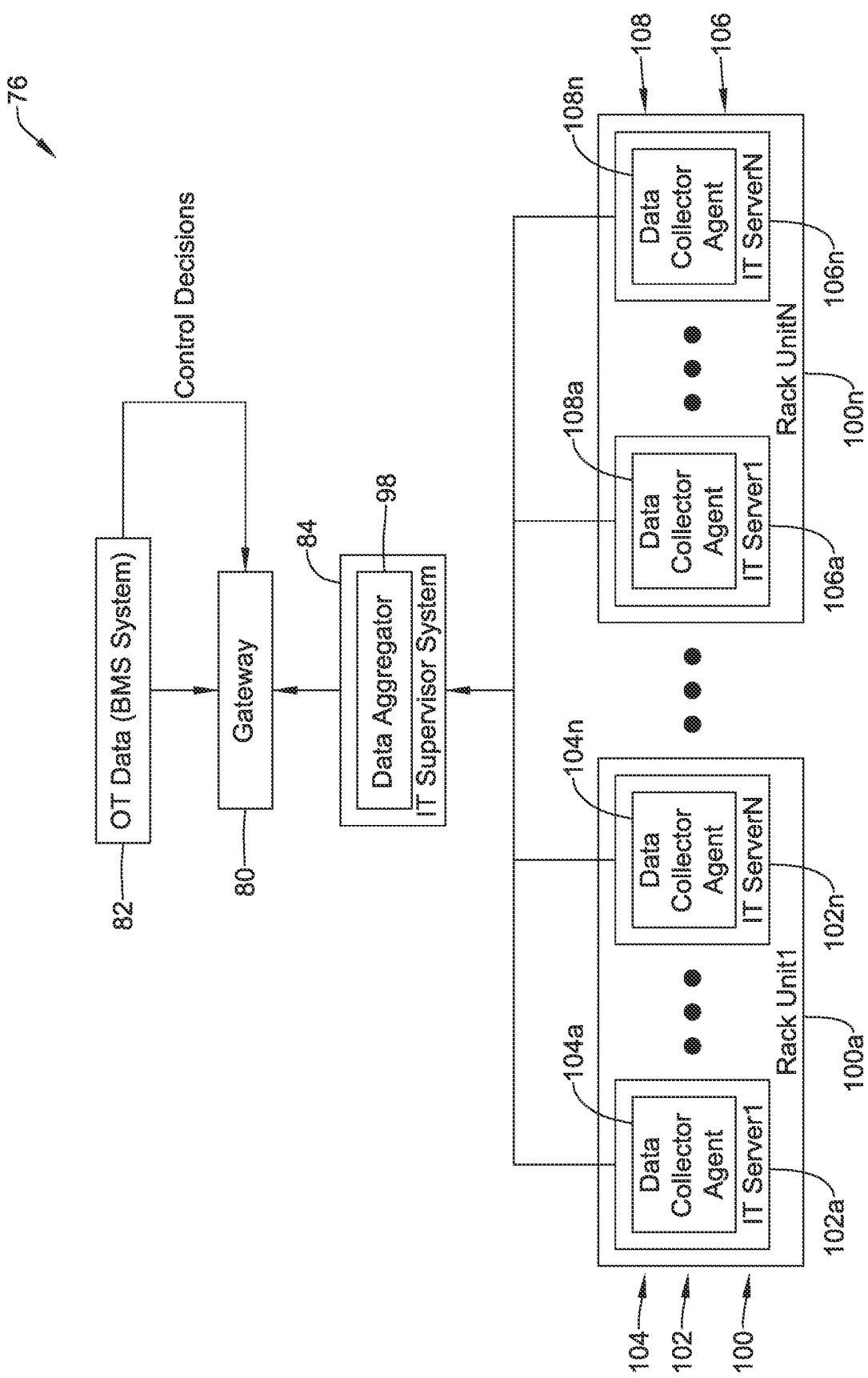
FIG. 8 is a schematic block diagram showing an illustrative method of data collection.

FIG. 8 is a schematic block diagram showing an illustrative method of how data is collected within the local component 76. In the example of FIG. 8, the gateway 80, the OT Data (BMS) system 82 and the IT Supervisor System 84 of FIG. 7 are shown. The IT Supervisor System 84 includes a Data Aggregator 98 that is configured to collect data from a number of server racks 100. The server racks 100, which are individually labeled as 100a through 100n, may be considered as being examples of the server racks 12. The server rack 100a includes a number of IT Servers 102 that are individually labeled as 102a through 102n. Each of the IT Servers 102 includes a Data Collector Agent 104, individually labeled as 104a through 104n. Similarly, the server rack 100n includes a number of IT Servers 106 that are individually labeled as 106a through 106n. Each of the IT Servers 106 includes a Data Collector Agent 108, individually labeled as 108a through 108n.

Figure 9A:
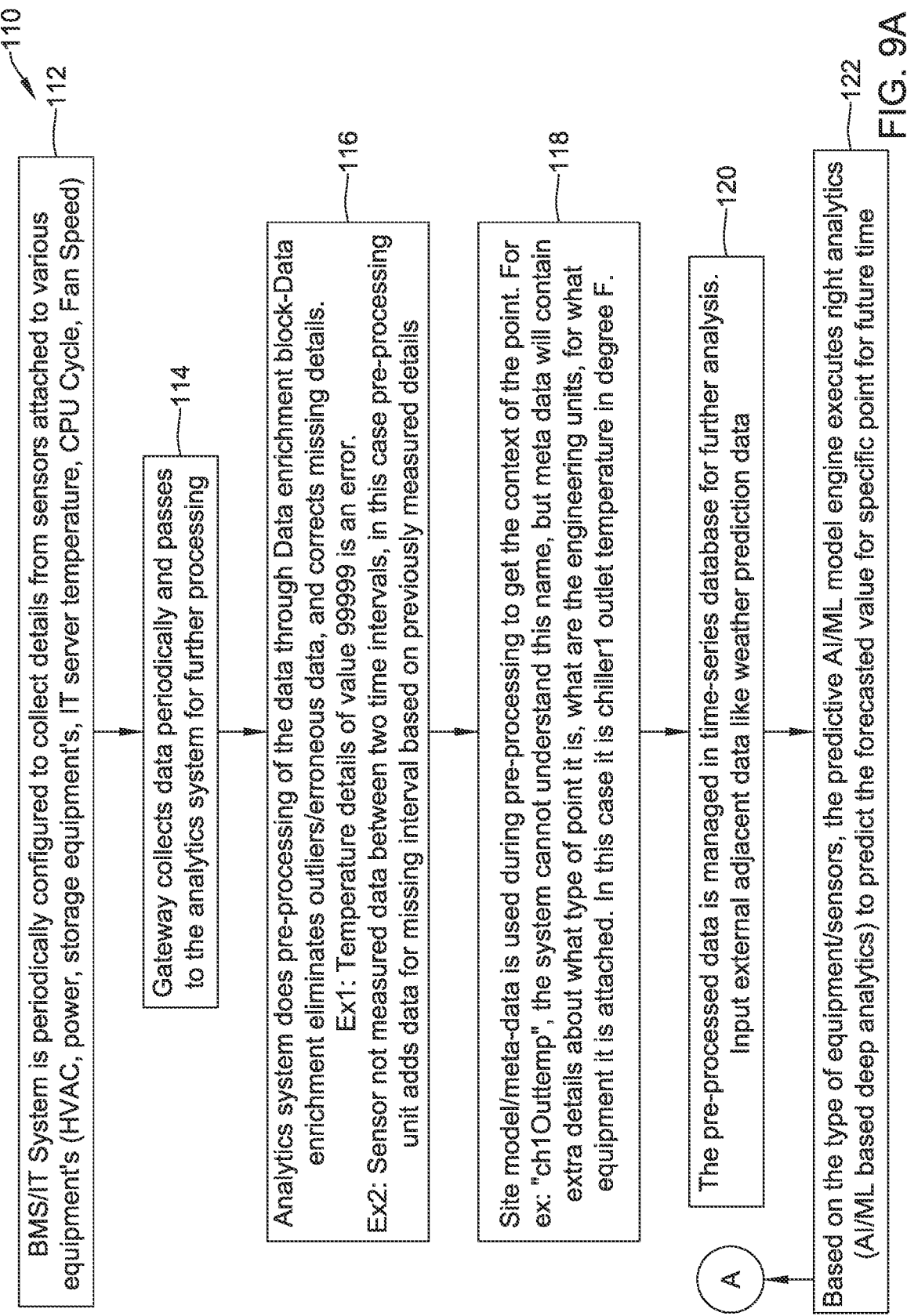
FIG. 9A and FIG. 9B are flow diagrams that together show an illustrative method.
Figure 9B:
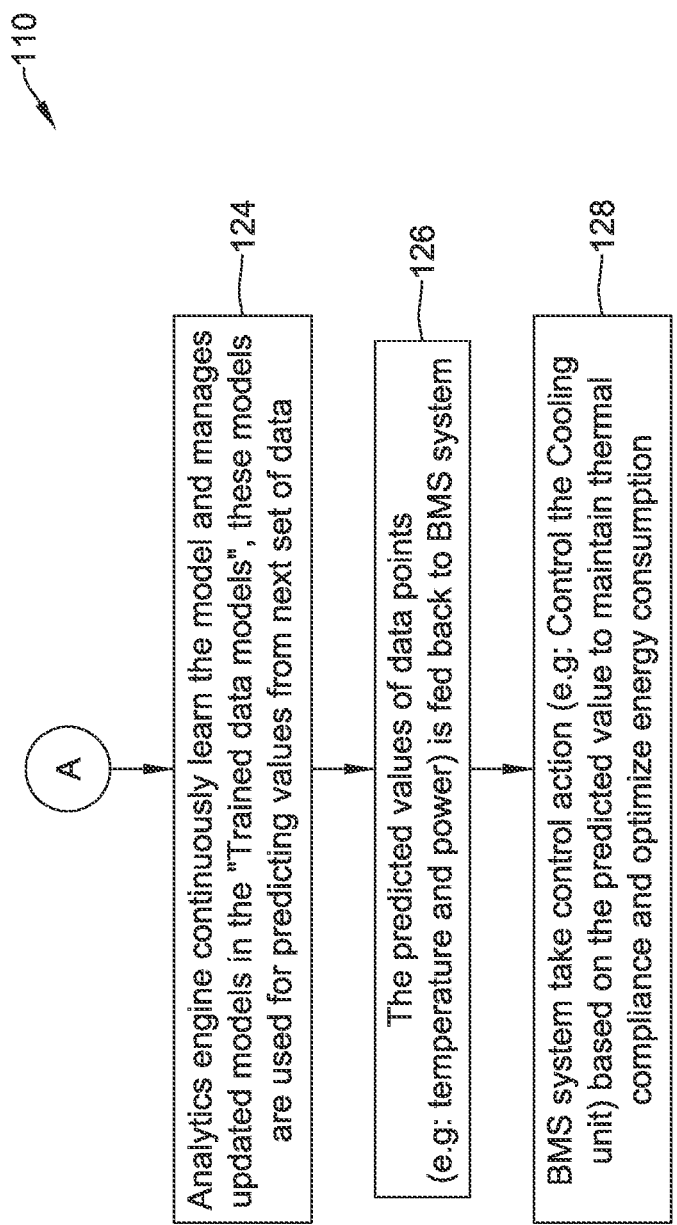

FIG. 9A and FIG. 9B are flow diagrams that together show an illustrative method 110. The method 110 includes periodically collecting data from a number of sensors that are attached to various equipment within the data center 10, as indicated at block 112. The gateway 80 (see FIGS. 7-8) periodically collects the data and passes the data along for analysis, as indicated at block 114. An analytics system performs pre-processing of the data in order to detect missing, incomplete or inaccurate data, as indicated at block 116. Metadata is used to ascertain a context of the missing, incomplete or inaccurate data, as indicated at block 118. The pre-processed data is stored in a time-series database for further analysis, as indicated at block 120. A predictive AI/ML model engine executes appropriate analytics on the data, as indicated at block 122.

With respect to FIG. 9B, the method 110 continues with the analytics engine continuously learning and updating the model (such as the model 30), as indicated at block 124. Predicted values of various data points such as temperatures are provided to the BMS system 23, as indicated at block 126. The BMS system 23 takes appropriate proactive control actions in order to maintain thermal compliance and optimize energy consumption, as indicated at block 128.

Figure 10:
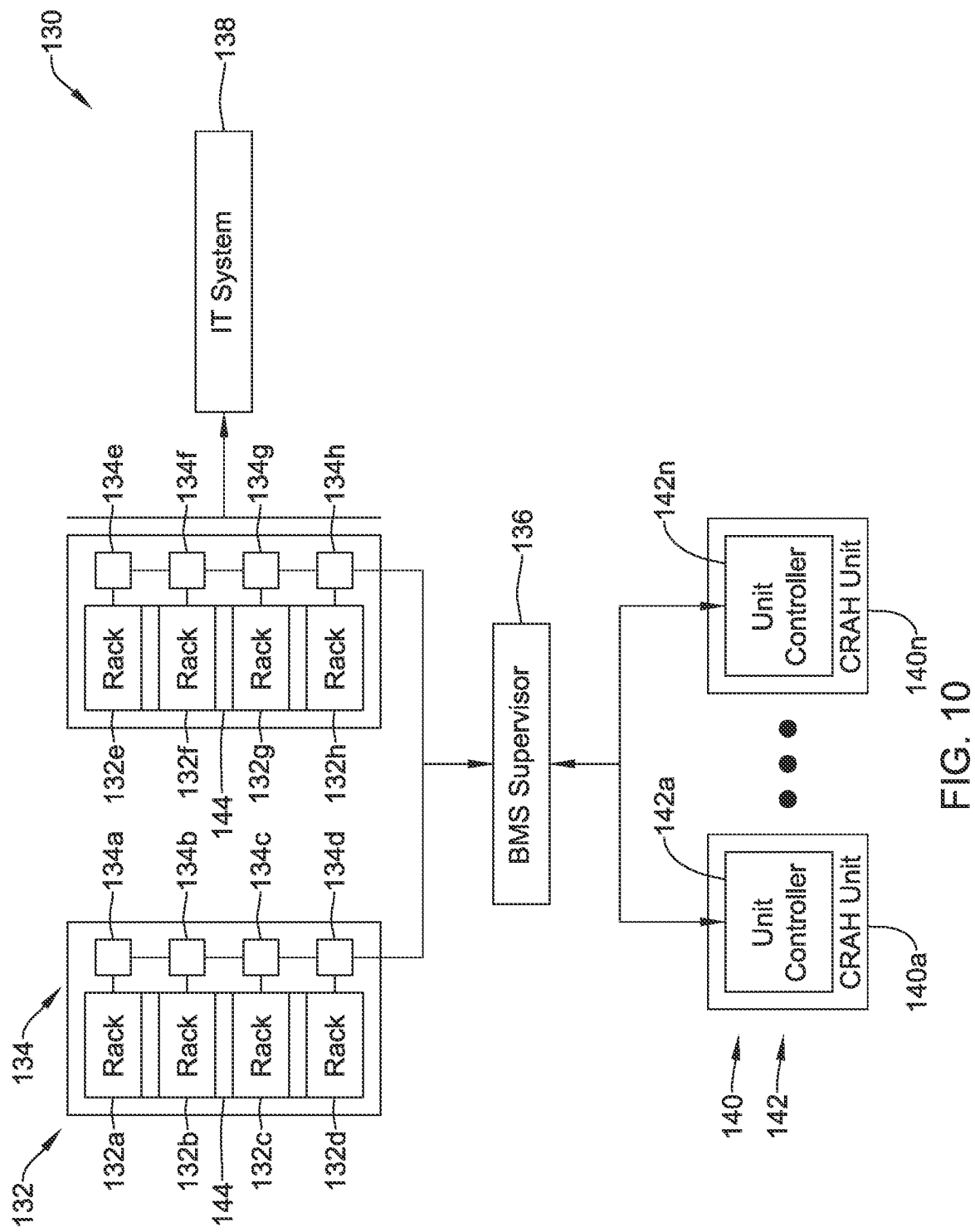
FIG. 10 is a schematic block diagram of an illustrative data center.

FIG. 10 is a schematic block diagram of an illustrative data center 130. The illustrative data center 130 may be considered as being an example of the data center 10. The data center 130 includes a number of server racks 132, individually labeled as server racks 132a, 132b, 132c, 132d, 132e, 132f, 132g and 132h. It will be appreciated that this is merely illustrative, as the data center 130 may include any number of server racks 132. Each of the server racks 132 include a number of external sensors 134, individually labeled as 134a, 134b, 134c, 134d, 134e, 134f, 134g and 134h.

A BMS Supervisor 136, which may be considered as being an example of the OT Data (BMS) system 82, is configured to collect OT data from the external sensors 134. This may include server rack temperature data, server rack power data, cooling unit data, humidity and pressure, for example. An IT system 138, which may be considered as being an example of the IT Supervisor System 84, is configured to collect IT data from the servers in the server racks 132. Examples of IT data include server computation utilization, CPU fan speed, server temperature and server power, among others.

A number of CRAH units 140, individually labeled as 140a through 140n, may be considered as examples of the environmental control equipment 14. The CRAH units 140 provide cooling to the server racks 132, including in-rack cooling 144. In some cases, there may be a distinct CRAH unit 140 for each of the server racks 132. In some instances, each CRAH unit 140 may be assigned to two or more of the server racks 132. Each of the CRAH units 140 includes a Unit Controller 142, individually labeled as 142a through 142n, that is configured to communicate with the BMS Supervisor 136.

Figure 11:
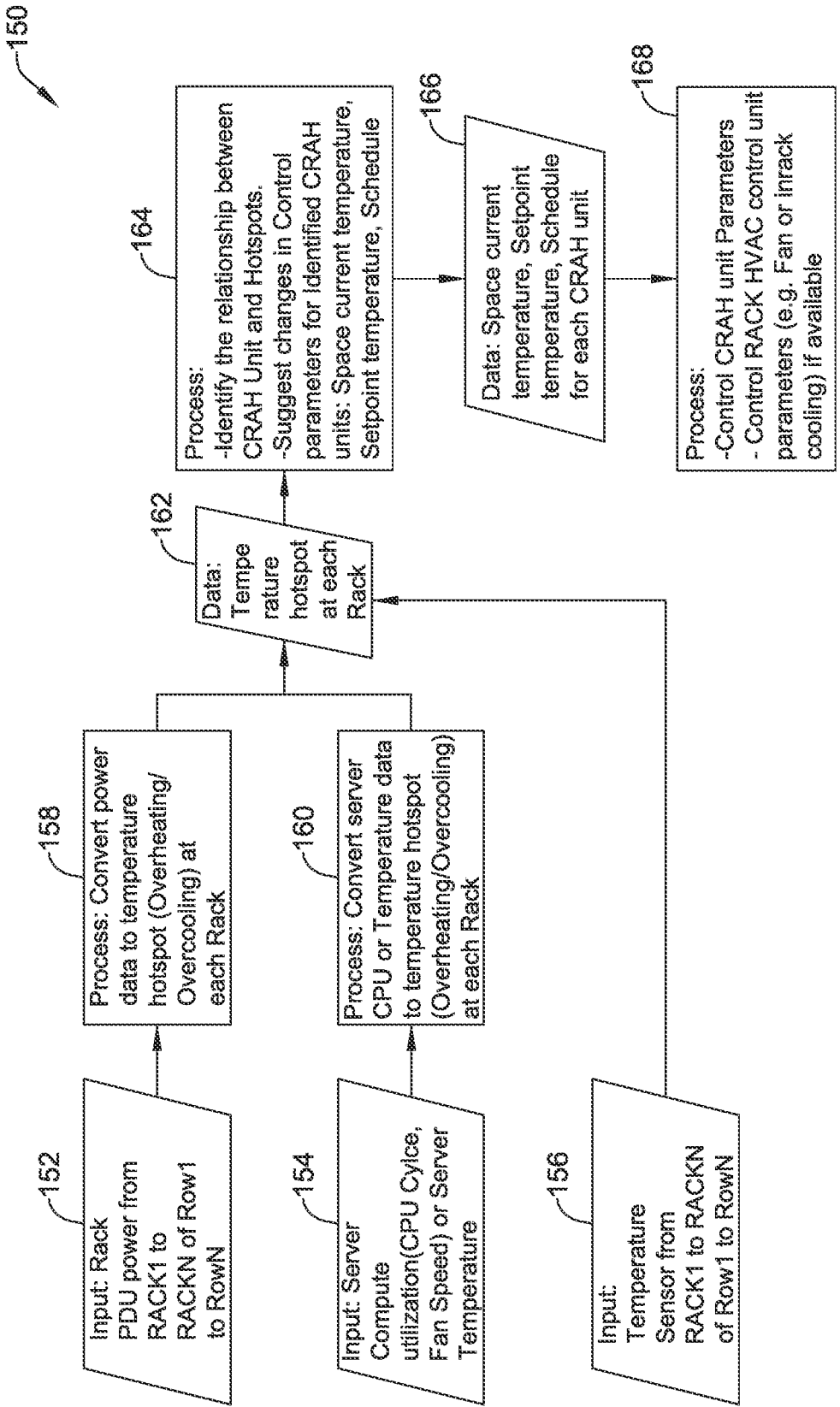
FIG. 11 is a flow diagram showing an illustrative method.

FIG. 11 is a flow diagram showing an illustrative method 150. Input block 152 includes server rack power data, input block 154 includes server rack-related IT data, and input block 156 includes server rack-related OT data including temperature values. At process block 158, the power data from the input block 152 is processed to identify temperature hotspots. At process block 160, the server rack-related IT data is processed to identify temperature hotspots. A data block 162 receives the temperature data from the input block 156, the process block 158 and the process block 160.

A process block 164 receives temperature data from the data block 162. The process block 164 identifies relationships between CRAH unit and corresponding temperature hotspots, and suggests changes in control parameters for operating one or more of the CRAH units. The process block 164 provides control data to a data block 166. The control data is then provided to a process block 168, at which point the CRAH units are controlled accordingly.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A method for controlling one or more environmental conditions within one or more server racks of a data center, wherein the data center includes a plurality of server racks with each server rack hosting one or more servers, the data center including environment control equipment for controlling the one or more environmental conditions within one or more of the plurality of server racks of the data center, the method comprising:
receiving one or more environmental conditions within each of the plurality of server racks over time;
receiving one or more IT parameters representative of a server load on one or more servers within each of the plurality of server racks over time;
building a model that models how one or more of the environmental conditions within at least one of the server racks of the plurality of server racks responds to changes in one or more of the IT parameters representative of the server load on one or more servers within the corresponding server rack;
with the model built, receiving one or more subsequent IT parameters representative of the server load on one or more servers within at least one of the plurality of server racks;
predicting a future value of one or more environmental conditions within one or more of the plurality of server racks based at least in part on the model and the one or more subsequent IT parameters and optionally predicting future power consumption based upon the one or more IT parameters; and
proactively controlling at least some of the environment control equipment of the data center based at least in part on the predicted future value of one or more of the environmental conditions within the one or more server racks such that the predicted future value of one or more of the environmental conditions within the one or more server racks remains below a corresponding threshold value.

2. The method of claim 1, wherein one or more of the environmental conditions within one or more of the plurality of server racks comprises temperature.

3. The method of claim 2, wherein the environment control equipment of the data center comprises cooling equipment, and proactively controlling at least some of the environment control equipment of the data center comprises proactively controlling the cooling equipment based at least in part on the predicted future value of the temperature within the one or more server racks.

4. The method of claim 1, wherein the one or more IT parameters comprises one or more of a CPU utilization parameter of a corresponding server, a CPU fan speed parameter of a corresponding server, an I/O throughput of a corresponding server, a memory access rate of a corresponding server, and a disk access rate of a corresponding server.

5. The method of claim 1, wherein the one or more IT parameters comprises one or more of a server temperature and a server power draw provided by a corresponding server.

6. The method of claim 1, wherein building the model comprises machine learning.

7. The method of claim 6, wherein the future value of one or more of the environmental conditions is predicted to occur at a future time, and wherein the future value of the one or more of the environmental conditions is compared to a corresponding measured value of the one or more of the environmental conditions measured at the future time in order to provide feedback for machine learning.

8. A method for controlling temperatures within a data center including a plurality of server racks, with a plurality of servers within each of the plurality of server racks, the data center having a cooling capacity directable to each of the plurality of server racks, the method comprising:
receiving an indication of one or more thermal properties within each of the plurality of server racks;
receiving an indication of power consumption by one or more server racks of the plurality of server racks within the data center;
using machine learning to predict future values of one or more of the thermal properties within the one or more server racks based at least in part upon the received indication of power consumption and the received one or more environmental conditions within each of the plurality of server racks; and
proactively controlling the cooling capacity directed to the one or more server racks based at least in part on the predicted future values of one or more thermal properties within the one or more server racks such that the predicted future value of one or more of the thermal properties within the one or more server racks remains below a corresponding first threshold value.

9. The method of claim 8, wherein the cooling capacity directed to the one or more server racks is increased when the predicted future value of one or more thermal properties is predicted to exceed the corresponding first threshold value.

10. The method of claim 8, wherein the cooling capacity directed to the one or more server racks is decreased when the predicted future value of one or more thermal properties is predicted to drop below a corresponding second threshold value.

11. The method of claim 8, wherein one or more of the thermal properties comprise a temperature within one of the plurality of server racks.

12. The method of claim 8, wherein the data center includes a building management system (BMS) in communication with an analytics engine that is remote from the data center, the method comprises:
using machine learning on the remote analytics engine to predict the future values of one or more thermal properties within the one or more server racks based at least in part upon the received indication of power consumption and the received one or more environmental conditions within each of the plurality of server racks; and
the BMS controlling the cooling capacity directed to the one or more server racks based at least in part on the predicted future values of one or more thermal properties within the one or more server racks such that the predicted future value of one or more of the thermal properties within the one or more server racks remains below the corresponding first threshold value.

13. The method of claim 8, further comprising:
receiving one or more IT parameters representative of a server load on one or more servers within each of the plurality of server racks; and
using machine learning to predict future values of one or more of the thermal properties within the one or more server racks based at least in part upon the received indication of power consumption, the received one or more environmental conditions within each of the plurality of server racks and the received one or more IT parameters representative of the server load on one or more servers within each of the plurality of server racks.

14. The method of claim 13, wherein the one or more IT parameters comprises one or more of a CPU utilization parameter of a corresponding server, a CPU fan speed parameter of a corresponding server, an I/O throughput of a corresponding server, a memory access rate of a corresponding server, and a disk access rate of a corresponding server.

15. The method of claim 13, wherein the one or more IT parameters comprises one or more of a server temperature and a server power draw provided by a corresponding server.

16. The method of claim 15, wherein one or more of the environmental conditions within each of the plurality of server racks comprises one or more of a server rack temperature sensed by the corresponding server rack, a server rack power draw sensed by the corresponding server rack, a server rack humidity data sensed by the corresponding server rack and a server rack pressure data sensed by the corresponding server rack.

17. A system for controlling a temperature within one or more server racks of a data center, wherein the data center includes a plurality of server racks with each server rack hosting one or more servers, the data center including environment control equipment for controlling the temperature within one or more of the plurality of server racks of the data center, the system comprising:
    a memory for storing a model that models how one or more of environmental conditions within at least one of the plurality of server racks responds to changes in one or more IT parameters representative of a server load on one or more servers within the corresponding server rack;
    a controller operatively coupled to the memory, the controller configured to:
        receive one or more IT parameters representative of the server load on one or more servers within at least one of the plurality of server racks;
        predict a future value of one or more environmental conditions within one or more of the plurality of server racks based at least in part on the model and the one or more IT parameters; and
        proactively control at least some of the environment control equipment of the data center based at least in part on the predicted future value of one or more of the environmental conditions within the one or more server racks such that the predicted future value of one or more of the environmental conditions within the one or more server racks remains below a corresponding threshold value.

18. The system of claim 17, wherein the one or more IT parameters comprises one or more of a CPU utilization parameter of a corresponding server, a CPU fan speed parameter of a corresponding server, an I/O throughput of a corresponding server, a memory access rate of a corresponding server, and a disk access rate of a corresponding server.

* * * * *